United States Patent
Dong et al.

(10) Patent No.: US 9,947,859 B2
(45) Date of Patent: Apr. 17, 2018

(54) ELECTRONIC DEVICE AND METHOD FOR FABRICATING THE SAME

(71) Applicants: SK hynix Inc., Gyeonggi-do OT (KR); TOSHIBA MEMORY CORPORATION, Tokyo OT (JP)

(72) Inventors: Cha-Deok Dong, Gyeonggi-do (KR); Daisuke Watanabe, Tokyo (JP); Kazuya Sawada, Tokyo (JP); Young-Min Eeh, Tokyo (JP); Koji Ueda, Tokyo (JP); Toshihiko Nagase, Tokyo (JP)

(73) Assignees: SK Hynix Inc., Gyeonggi-do (KR); TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 14/559,546

(22) Filed: Dec. 3, 2014

(65) Prior Publication Data

US 2015/0255708 A1    Sep. 10, 2015

(30) Foreign Application Priority Data

Mar. 4, 2014 (KR) .......................... 10-2014-0025444

(51) Int. Cl.
| | |
|---|---|
| *G11C 11/00* | (2006.01) |
| *H01L 43/02* | (2006.01) |
| *H01L 43/12* | (2006.01) |
| *H01L 43/08* | (2006.01) |
| *G11C 11/16* | (2006.01) |
| *H01L 27/22* | (2006.01) |

(52) U.S. Cl.
CPC ............ *H01L 43/02* (2013.01); *G11C 11/161* (2013.01); *H01L 43/08* (2013.01); *H01L 43/12* (2013.01); *H01L 27/228* (2013.01)

(58) Field of Classification Search
CPC ..................................................... H01L 27/222
USPC ......................................................... 365/158
See application file for complete search history.

(56) References Cited

U.S. PATENT DOCUMENTS

| | | | | |
|---|---|---|---|---|
| 2014/0087483 | A1* | 3/2014 | Ohsawa ................. | H01J 37/08 438/3 |
| 2014/0250244 | A1* | 9/2014 | Song ..................... | G06F 3/0673 710/5 |

FOREIGN PATENT DOCUMENTS

| | | |
|---|---|---|
| KR | 1020110002864 | 1/2011 |
| KR | 1020030002141 | 1/2013 |

* cited by examiner

*Primary Examiner* — Anthan Tran
(74) *Attorney, Agent, or Firm* — IP & T Group LLP (57) ABSTRACT

An electronic device that includes a first structure including a first magnetic layer, a second magnetic layer, and a tunnel barrier layer which is interposed between the first magnetic layer and the second magnetic layer; and a second structure disposed over the first structure, and including a magnetic correction layer for correcting a magnetic field of the first structure, wherein a width of a bottom surface of the second structure is larger than a width of a top surface of the first structure.

12 Claims, 8 Drawing Sheets

ELECTRONIC DEVICE AND METHOD FOR FABRICATING THE SAME

CROSS-REFERENCE TO RELATED APPLICATIONS

The present application claims priority of Korean Patent Application No. 10-2014-0025444, entitled "ELECTRONIC DEVICE AND METHOD FOR FABRICATING THE SAME" and filed on Mar. 4, 2014, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which an electronic device capable of improving a switching characteristic and decreasing the level of processing difficulty and a method for fabricating the same are provided.

In one aspect, an electronic device is provided to include a semiconductor memory unit that include: a first structure including a first magnetic layer, a second magnetic layer, and a tunnel barrier layer which is interposed between the first magnetic layer and the second magnetic layer; and a second structure disposed over the first structure, and including a magnetic correction layer for correcting a magnetic field of the first structure, wherein a width of a bottom surface of the second structure is larger than a width of a top surface of the first structure.

Implementations of the above electronic device may include one or more the following.

The semiconductor memory unit may include: The first structure may have a width that gradually increases in a downward direction. Sidewalls of the second structure may have a vertical profile. The first structure may further include a magnetic insulation layer which is arranged at an uppermost part of the first structure. The second structure may further include a conductive top layer which is arranged at an uppermost part of the second structure. The first magnetic layer may have a magnetization direction that is vertical with respect to a surface of the first magnetic layer and is changeable, the second magnetic layer may have a magnetization direction that is vertical with respect to a surface of the second magnetic layer and is pinned, and the magnetic correction layer may have a magnetization direction that is opposite to the magnetization direction of the second magnetic layer. When a width of a bottom surface of the magnetic correction layer is W1, a width of the tunnel barrier layer is W2 and a width of a damaged portion of the magnetic correction layer is W3, an expression $W3/2 \leq (W1-W2)/2 \leq W3$ may be satisfied. A contact may be disposed under the first structure and electrically connected with the first structure, wherein a width of a bottom surface of the first structure may be equal to or smaller than a width of a top surface of the contact.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit is part of the memory or the buffer memory in the memory system.

In another aspect, a method is provided for fabricating an electronic device including a semiconductor memory unit, the method may include: forming a first magnetic layer, a tunnel barrier layer and a second magnetic layer over a substrate; forming a first structure by etching the first magnetic layer, the tunnel barrier layer and the second magnetic layer using a first mask pattern; forming a magnetic correction layer over the first structure; and forming a second structure by etching the magnetic correction layer using a second mask pattern with a width larger than the first mask pattern.

Implementations of the above method may include one or more of the following.

The method may further include: The forming of the first structure may comprise performing slope etching for the first structure, such that a width of the first structure gradually increases in a downward direction. The forming of the second structure may be performed such that sidewalls of the second structure have a vertical profile.

These and other aspects, implementations and associated advantages are described in greater detail in the drawings, the description and the claims.

DETAILED DESCRIPTION

Various examples and implementations of the disclosed technology are described below in detail with reference to the accompanying drawings.

The drawings may not be necessarily to scale and, in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1:
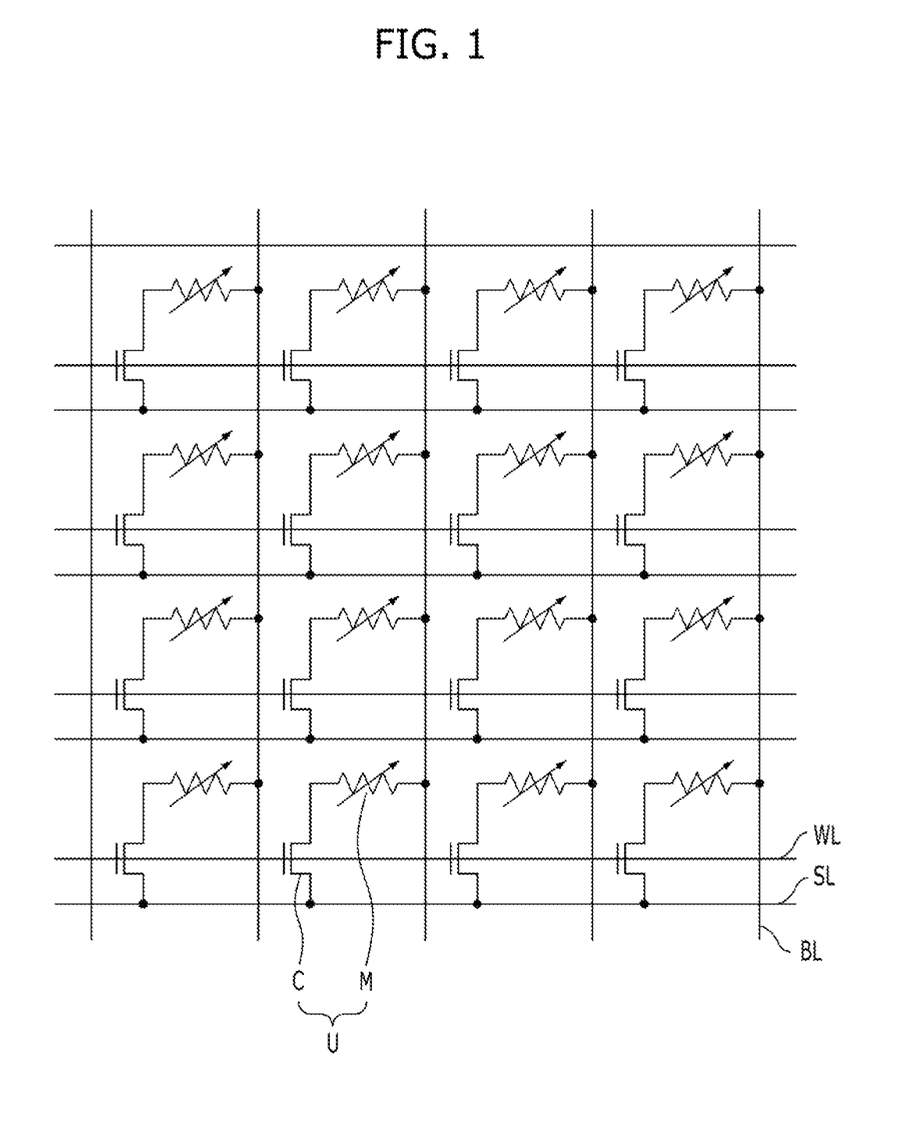
FIG. 1 is a diagram schematically showing a semiconductor device in accordance with an implementation of the disclosed technology.

FIG. 1 is a diagram schematically showing a semiconductor device in accordance with an example.

Referring to FIG. 1, the semiconductor device may include a cell array in which a plurality of unit cells U is disposed in the form of a matrix. Each of the unit cells U may include a resistance variable element M and a selection element C.

The resistance variable element M has different resistant states depending on voltages or current applied, and may store multi-bit data using such a characteristic. For example, in the case where the resistance variable element M is in a low resistant state, data '0' may be stored, and in the case where the resistance variable element M is in a high resistant state, data '1' may be stored. One end of such a resistance variable element M may be electrically connected to a bit line BL, and the other end thereof may be electrically connected to one end of the selection element C.

The selection element C may select a specific unit cell U, and may be a transistor as shown in the drawing. In this case, a drain of the transistor may be connected to the resistance variable element M, a source of the transistor may be connected to a source line SL, and a gate of the transistor may be connected to a word line WL. However, the disclosed technology is not limited to such, and the selection element C may be formed as various other elements, for example, a diode.

Hereinbelow, a structure of and a method for fabricating the resistance variable element M of FIG. 1 will be described with reference to FIGS. 2A to 6.

Figure 2A:
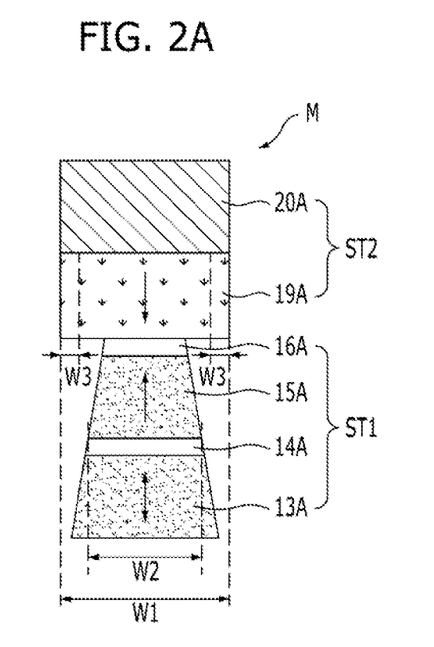
FIG. 2A is a diagram showing a resistance variable element of the semiconductor device in accordance with the implementation of the disclosed technology.
Figure 2B:
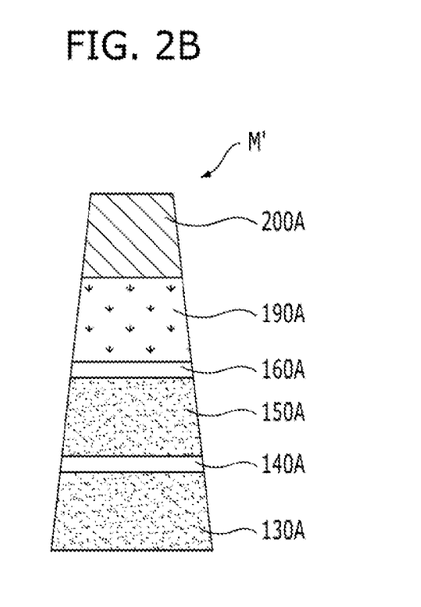
FIG. 2B is a diagram showing a resistance variable element according to a comparative example, for comparison with the resistance variable element of FIG. 2A.

FIG. 2A is a diagram showing a resistance variable element of the semiconductor device in accordance with the implementation of the disclosed technology, and FIG. 2B is a diagram showing a resistance variable element according to a comparative example, for comparison with the resistance variable element of FIG. 2A. For the sake of convenience in explanation, only one resistance variable element is shown.

Referring to FIG. 2A, the resistance variable element M includes a first structure ST1 which is disposed over a substrate (not shown) and includes a first magnetic layer 13A, a second magnetic layer 15A and a tunnel barrier layer 14A interposed between the first magnetic layer 13A and the second magnetic layer 15A, and a second structure ST2 which is disposed over the first structure ST1 and includes a magnetic correction layer 19A for correcting the magnetic field of the first structure ST1.

The first magnetic layer 13A of the first structure ST1 may be a free magnetic layer which has a changeable magnetization direction (see the arrow of the first magnetic layer 13A), and the second magnetic layer 15A of the first structure ST1 may be a pinned magnetic layer which has a pinned magnetization direction (see the arrow of the second magnetic layer 15A). Conversely, it may be envisaged that the first magnetic layer 13A is a pinned magnetic layer and the second magnetic layer 15A is a free magnetic layer. The magnetization directions of the first and second magnetic layers 13A and 15A may be perpendicular to the surfaces of the first and second magnetic layers 13A and 15A as indicated by the arrows. The tunnel barrier layer 14A is capable of tunneling electrons to allow the magnetization direction of the free magnetic layer to be changed. The first magnetic layer 13A or the second magnetic layer 15A may be a single layer or a multi-layer including a ferromagnetic material, for example, a Fe—Pt alloy, a Fe—Pd alloy, a Co—Pd alloy, a Co—Pt alloy, a Co—Fe alloy, a Fe—Ni—Pt alloy, a Co—Fe—Pt alloy or a Co—Ni—Pt alloy, and may further include an impurity such as boron (B), but not limited to such. The tunnel barrier layer 14A may be a single layer or a multi-layer including an oxide, for example, $Al_2O$, MgO, CaO, SrO, TiO, VO or NbO, but not limited to such. Such a first structure ST1 may have a characteristic that resistance is changed according to current supplied through the bottom end and the top end thereof, and accordingly, may store data. For example, in the case where the magnetization directions of the first magnetic layer 13A and the second magnetic layer 15A are parallel, the first structure ST1 may be in a low resistant state, and in the case where the magnetization directions of the first magnetic layer 13A and the second magnetic layer 15A are non-parallel, the first structure ST1 may be in a high resistant state.

Meanwhile, in the first structure ST1, as the magnetic field generated by the pinned magnetic layer exerts an influence on the free magnetic layer, a phenomenon occurs in which a magnetic field is deflected. According to this fact, in the case where the resistance variable element M is constituted by only the first structure ST1, a problem may be caused in that the switching of the resistance variable element M is likely to asymmetrically occur. In order to prevent such a magnetic field deflection phenomenon, the resistance variable element M of the present implementation further includes the second structure ST2 which includes the magnetic correction layer 19A.

The magnetic correction layer 19A of the second structure ST2 may offset the influence of the magnetic field that is exerted on the free magnetic layer by the pinned magnetic layer, and may prevent the magnetic field deflection of the first structure ST1. The magnetic correction layer 19A may have a magnetization direction (see the arrow of the magnetic correction layer 19A) opposite to the pinned magnetic layer, and may be a single layer or a multi-layer including a ferromagnetic material, for example, a Co metal, a Fe metal, a Fe—Pt alloy, a Fe—Pd alloy, a Co—Pd alloy, a Co—Pt alloy, a Fe—Ni—Pt alloy, a Co—Fe—Pt alloy or a Co—Ni—Pt alloy. In particular, in the case where the magnetic correction layer 19A is a multi-layer including at least 2 ferromagnetic material layers, a noble metal layer such as platinum (Pt) or palladium (Pd) may be interposed between the ferromagnetic material layers. For example, the magnetic correction layer 19A may include a stack structure of a ferromagnetic material layer/a noble metal layer/a ferromagnetic material layer. In another implementation, the magnetic correction layer 19A may be a single layer or a multi-layer including an anti-ferromagnetic material, for example, FeMN, NiMn, PtMn, PdMn, PtPdMn, RuMn, OsMn, IrMn or CrPtMn.

The first structure ST1 may further include a magnetic insulation layer 16A on the uppermost part thereof. The magnetic insulation layer 16A is interposed between the second magnetic layer 15A and the magnetic correction layer 19A, performs the function of providing magnetic insulation, and may include a conductive material such as a metal. Also, while not shown, the first structure ST1 may further include a bottom layer on the lowermost part thereof. The bottom layer may be interposed between a bottom contact which is connected to a bottom end of the resistance variable element M to supply current and the resistance variable element M. The bottom layer may electrically connect them with each other and may perform various roles required in the resistance variable element M, for example, the role of controlling the crystallinity of the first magnetic layer 13A. Such a bottom layer may be a single layer or a multi-layer including a conductive material, for example, a metal such as Ti, Hf, Zr, Mn, Cr, Zn, Mg, Al, W or Ta, a nitride of the metal, or an oxide of the metal, but not limited thereto. The second structure ST2 may further include a top layer 20A on the uppermost part thereof. The top layer 20A may be interposed between a top contact (not shown) which is connected to a top end of the resistance variable element M to supply current and the resistance variable element M. The top layer 20A may electrically connect them with each other and may serve as a hard mask for patterning of the magnetic correction layer 19A. The top layer 20A may be a single layer or a multi-layer including a conductive material, for example, a metal, a metal oxide or a metal nitride, but not limited thereto.

Although more detailed descriptions will be provided below, in the present implementation, the first structure ST1 and the second structure ST2 may be patterned using different masks. A mask for patterning the first structure ST1 may be smaller than a mask for patterning the second structure ST2. Thus, a width of the top surface of the first structure ST1 may be smaller than a width W1 of the bottom surface of the second structure ST2. Sidewalls of the second structure ST2 may be substantially vertical, and in this case, the width W1 of the bottom surface of the second structure ST2 may be measured in a horizontal direction of the second structure ST2. Furthermore, sidewalls of the first structure ST1 may have a sloped profile and, accordingly, the width of the first structure ST1 gradually increases downward and a width of the top surface of the first structure ST1 is narrow. Effects achieved by the resistance variable element M of the present implementation having such first and second structures ST1 and ST2 will be described in comparison with a resistance variable element M' of a comparative example.

Referring to FIG. 2B, the resistance variable element M' of the comparative example has the same layer structure as the resistance variable element M. That is to say, the resistance variable element M' of the comparative example may include a first magnetic layer 130A, a tunnel barrier layer 140A, a second magnetic layer 150A, a magnetic insulation layer 160A, a magnetic correction layer 190A, and a top layer 200A, which are sequentially stacked. However, the resistance variable element M' of the comparative example is different from the resistance variable element M according to present implementation in that the stack structure of the first magnetic layer 130A, the tunnel barrier layer 140A, the second magnetic layer 150A, the magnetic insulation layer 160A, the magnetic correction layer 190A and the top layer 200A is patterned using one mask.

In the case where patterning is performed using one mask as in the comparative example, a width of the bottom surface of the magnetic correction layer 190A cannot be larger than a width of the top surface of the underlying structure. Therefore, if sidewalls of the magnetic correction layer 190A are partially damaged due to etching, magnetic field correction efficiency deteriorates in correspondence to the damage made to the sidewalls of the magnetic correction layer 190A. While a thickness of the magnetic correction layer 190A should be thick enough to compensate for such a situation, an increase in thickness of the magnetic correction layer 190A may make it difficult to pattern the magnetic correction layer 190A. In particular, since the resistance variable element M' of the comparative example is patterned using one mask, an increase in thickness of the magnetic correction layer 190A makes the patterning of the resistance variable element M' difficult.

In contrast, in the case of the present implementation, since the width W1 of the bottom surface of the magnetic correction layer 19A is larger than the width of the top surface of the first structure ST1. Thus, even when sidewalls of the magnetic correction layer 19A are partially damaged due to etching and thus a dead portion incapable of performing the correction function generates, the remaining portion of the magnetic correction layer 19A may sufficiently perform the role of correcting a reflected magnetic field. Thus, since it is not necessary to increase a thickness of the magnetic correction layer 19A, patterning of the magnetic correction layer 19A may be easily performed. In addition, in the resistance variable element M according to the present implementation, because the second structure ST2 including the magnetic correction layer 19A and the first structure ST1 are separately patterned, patterning of the resistance variable element M may be easily performed.

Moreover, in the case where the magnetization directions of the first and second magnetic layer 13A and 15A are vertical, in the resistance variable element M according to the present implementation, the width of the first structure ST1 may be measured in reference to a width of the tunnel barrier layer 14A. In the present implementation, even though a width of the top surface of the first structure ST1 is small, since the sidewalls of the first structure ST1 have an inclined profile, the width W2 of the tunnel barrier layer 14A may be relatively large, and accordingly, it is possible to realize the first structure ST1 with a desired width.

In the resistance variable element M according to the present implementation, when a horizontal width of the dead portion of the magnetic correction layer 19A is W3, a formula W3/2≤(W1−W2)2≤W3 may be satisfied.

As can be readily seen from this formula, a value obtained by subtracting the width W2 of the first structure ST1 from the width W1 of the magnetic correction layer 19A is equal to or larger than the width W3 of the dead portion, and thus the function of the magnetic correction layer 19A may be maintained. In order to address this issue, if the width W1 of the magnetic correction layer 19A increases excessively, the degree of integration in the semiconductor device is degraded. Thus, in the present implementation, it is desirable that a value obtained by subtracting the width W2 of the first structure ST1 from the width W1 of the magnetic correction layer 19A is equal to or smaller than twice the width W3 of the dead portion. However, the value of W1−W2 is not limited thereto.

FIGS. 3 to 6 are cross-sectional views explaining a method for fabricating the semiconductor device in accordance with the implementation of the disclosed technology. A method for fabricating the semiconductor device including three resistance variable elements will be exemplarily explained.

Figure 3:
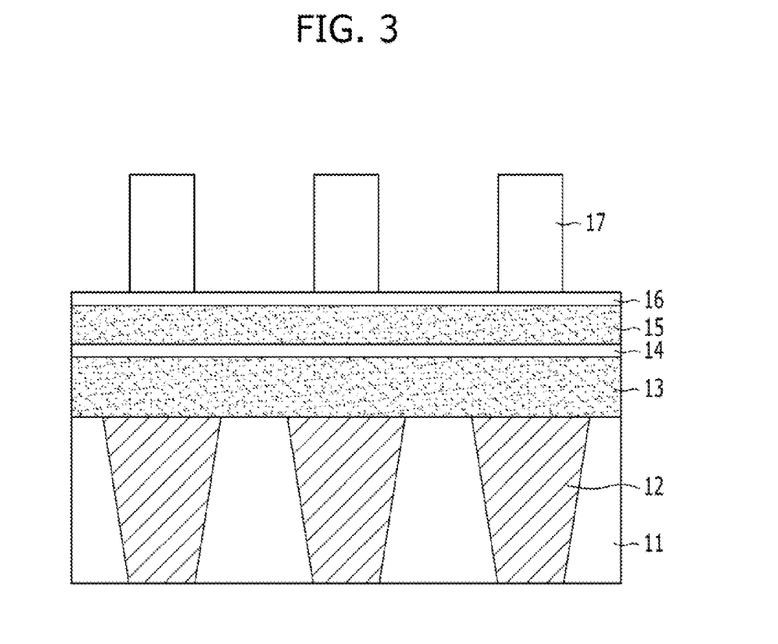
FIGS. 3 to 6 are cross-sectional views explaining a method for fabricating the semiconductor device in accordance with the implementation of the disclosed technology.

Referring to FIG. 3, a first interlayer dielectric layer 11 and bottom contacts 12 are formed on a substrate (not shown). The substrate may have predetermined desired structures, for example, including switching elements such as transistors. The bottom contacts 12 pass through the first interlayer dielectric layer 11 and may be connected to portions of the substrate. For example, the bottom contacts 12 may be coupled to one end of the switching elements. While not shown, the other end of the switching elements may be electrically connected with predetermined wiring lines, for example, source lines. The first interlayer dielectric layer 11 may include various dielectric materials such as a silicon oxide, and the bottom contacts 12 may include a conductive material, for example, a metal such as tungsten or a metal nitride such as titanium nitride.

A first magnetic layer 13, a tunnel barrier layer 14, a second magnetic layer 15 and a magnetic insulation layer 16 are formed on the first interlayer dielectric layer 11 and the bottom contacts 12.

First mask patterns 17 for patterning first structures ST1 (see FIG. 4) are formed on the stack structure of the first magnetic layer 13, the tunnel barrier layer 14, the second magnetic layer 15 and the magnetic insulation layer 16. The first mask patterns 17 are formed to respectively overlap with the bottom contacts 12, and may be formed to have a width smaller than the bottom contacts 12. The first mask patterns 17 may be formed as a single layer or a multi-layer including various materials such as a conductive material, a dielectric material, an organic material and a semiconductor material.

Figure 4:
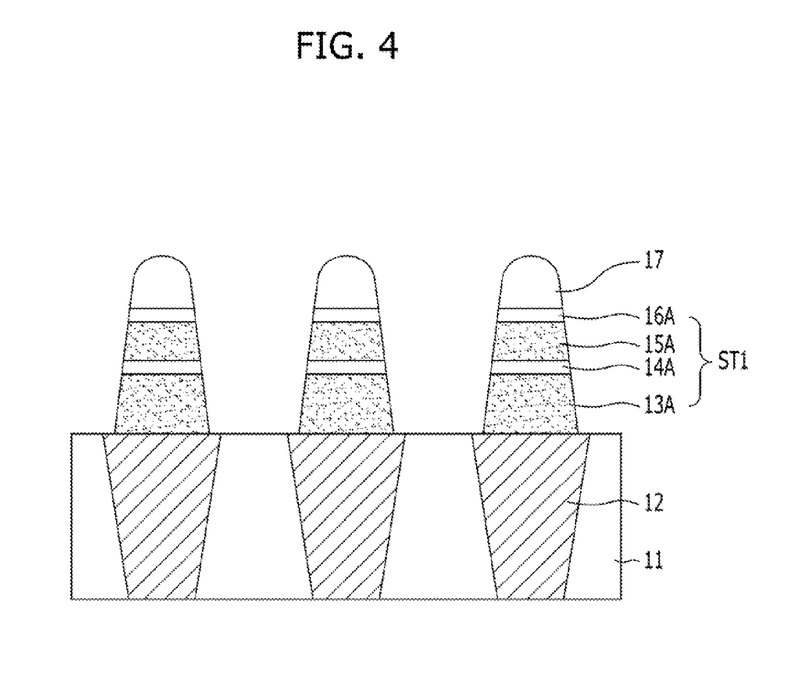

Referring to FIG. 4, by etching the magnetic insulation layer 16, the second magnetic layer 15, the tunnel barrier layer 14 and the first magnetic layer 13 using the first mask patterns 17 as etch barriers, the first structures ST1 are formed. The etched magnetic insulation layer 16, second magnetic layer 15, tunnel barrier layer 14 and first magnetic layer 13 are designated by the reference numerals 16A, 15A, 14A and 13A, respectively.

The etching process may be a slope etching process such that sidewalls of the first structures ST1 have inclined profiles. Even though the sidewalls of the first structures ST1 have inclined profiles, a width of the bottom surfaces of the first structures ST1 may be controlled to be equal to or smaller than a width of the top surfaces of the bottom contacts 12. This structure is advantageous in that it is easy to maintain the tunnel barrier layer 14A flat. During the etching process, the first mask patterns 17 may be partially lost.

Figure 5:
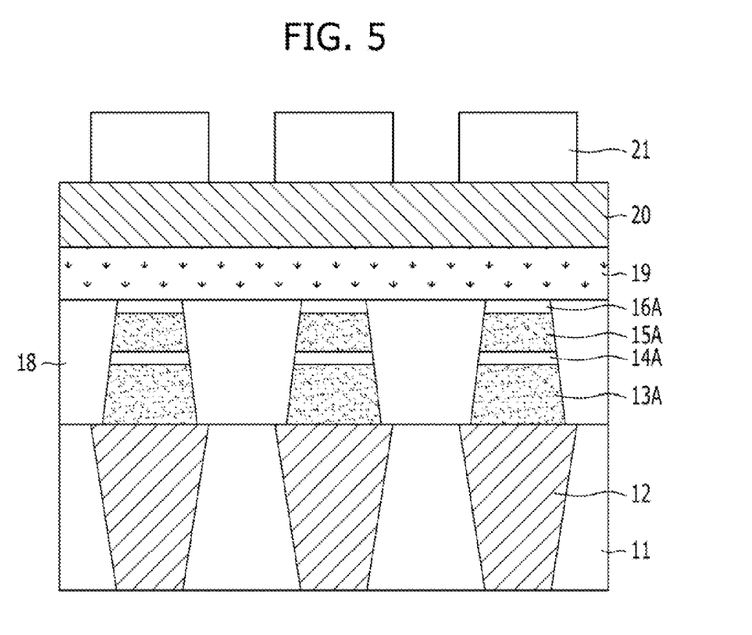

Referring to FIG. 5, after forming a dielectric material layer to cover the processing resultant of FIG. 4, a planarization process, for example, a CMP (chemical mechanical polishing) process, is performed until the magnetic insulation layer 16A is exposed. A second interlayer dielectric layer 18 is formed to fill spaces between the first structures ST1.

A magnetic correction layer 19 and a top layer 20 are formed over the second interlayer dielectric layer 18 and the first structures ST1.

Second mask patterns 21 for patterning second structures ST2 (see FIG. 6) are formed on the top layer 20. The second mask patterns 21 may be formed to respectively overlap with the first structures ST1 and have a width larger than the width of the top surfaces of the first structures ST1. Furthermore, the second mask patterns 21 may be larger than the width of the tunnel barrier layer 14A of the first structures ST1. The second mask patterns 21 may be formed as a single layer or a multi-layer including various materials such as a conductive material, a dielectric material, an organic material and a semiconductor material.

Figure 6:
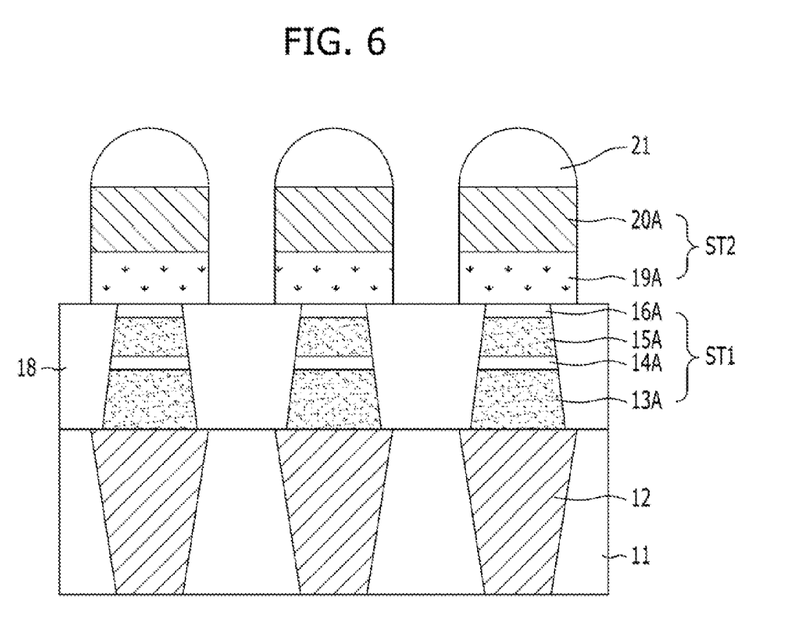

Referring to FIG. 6, the top layer 20 is etched using the second mask patterns 21 as etch barriers. The etched top layer 20 is designated by the reference numeral 20A. During this course, the second mask patterns 21 may be partially lost.

The magnetic correction layer 19 is etched using the top layer 20A as an etch barrier. The etched magnetic correction layer 19 is designated by the reference numeral 19A. As a result of the etching process, the second structures ST2 in which the magnetic correction layer 19A and the top layer 20A are stacked may be formed. The etching process may be performed such that sidewalls of the second structures ST2 have vertical profiles.

While not shown, after forming a third interlayer dielectric layer over the second structures ST2, top contacts connected with the top layer 20A is formed by forming a hole passing through the third interlayer dielectric layer and by forming wiring lines, for example, bit lines, connected with the top contacts on the third interlayer dielectric layer, and so forth.

The above and other memory circuits or semiconductor devices based on the disclosed technology can be used in a variety of devices or systems. FIGS. 7-11 provide some examples of devices or systems employing the memory circuits disclosed herein.

Figure 7:
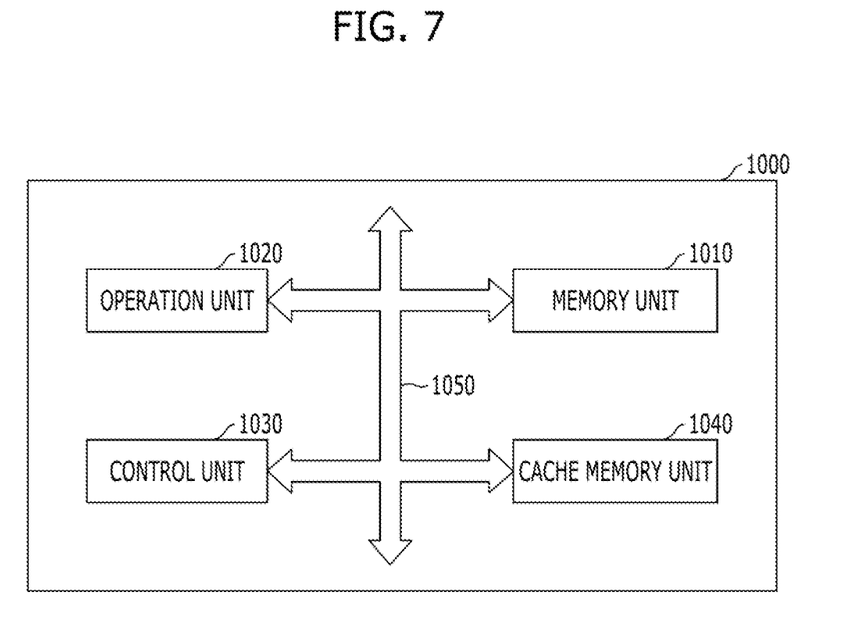
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a resistance variable element which includes a first structure including a first magnetic layer, a second magnetic layer, and a tunnel barrier layer which is interposed between the first magnetic layer and the second magnetic layer; and a second structure disposed over the first structure, and including a magnetic correction layer for correcting a magnetic field of the first structure, wherein a width of a bottom surface of the second structure is larger than a width of a top surface of the first structure. Through this, a fabrication process of the memory unit 1010 may become easy and the data storage characteristic of the memory unit 1010 may be improved. As a consequence, the operating characteristic of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
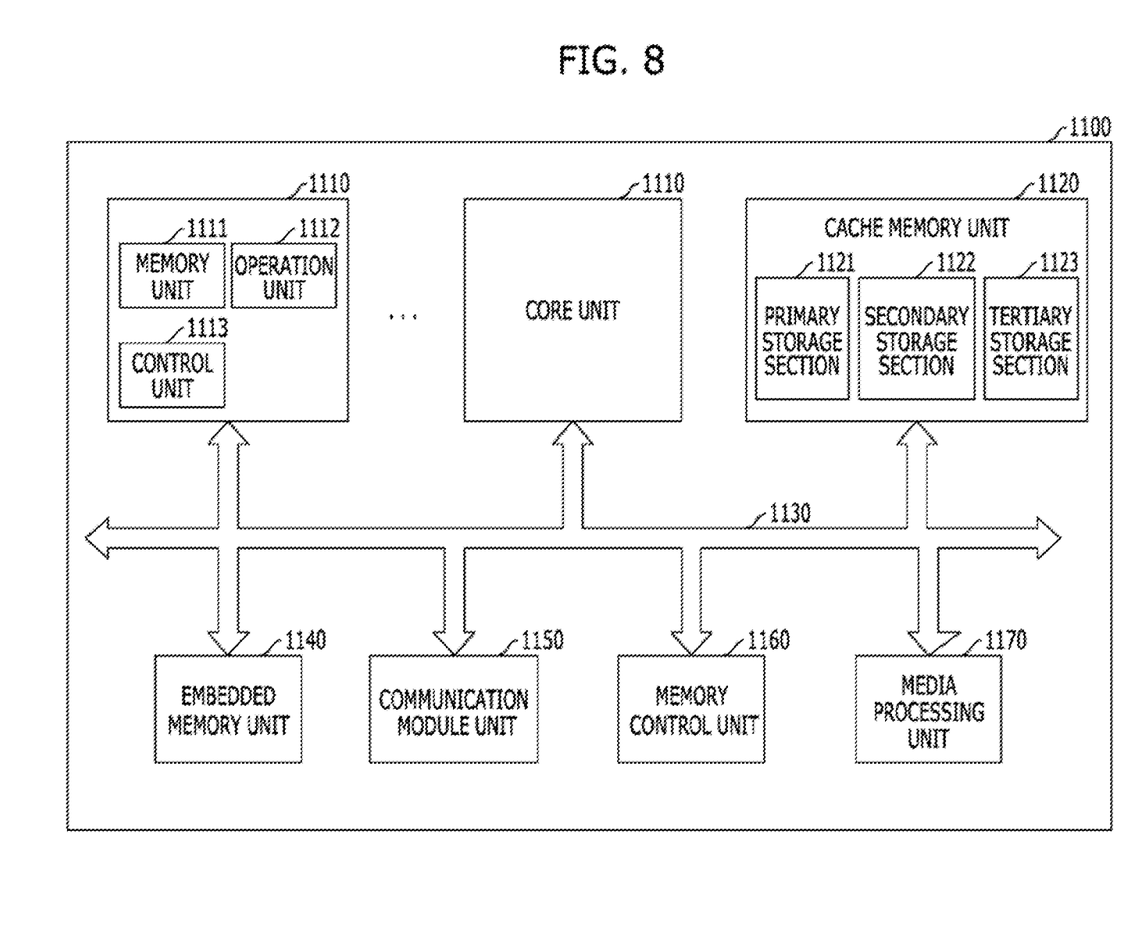
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a resistance variable element which includes a first structure including a first magnetic layer, a second magnetic layer, and a tunnel barrier layer which is interposed between the first magnetic layer and the second magnetic layer; and a second structure disposed over the first structure, and including a magnetic correction layer for correcting a magnetic field of the first structure, wherein a width of a bottom surface of the second structure is larger than a width of a top surface of the first structure. Through this, a fabrication process of the cache memory unit 1120 may become easy and the data storage characteristic of the cache memory unit 1120 may be improved. As a consequence, the operating characteristic of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CE) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
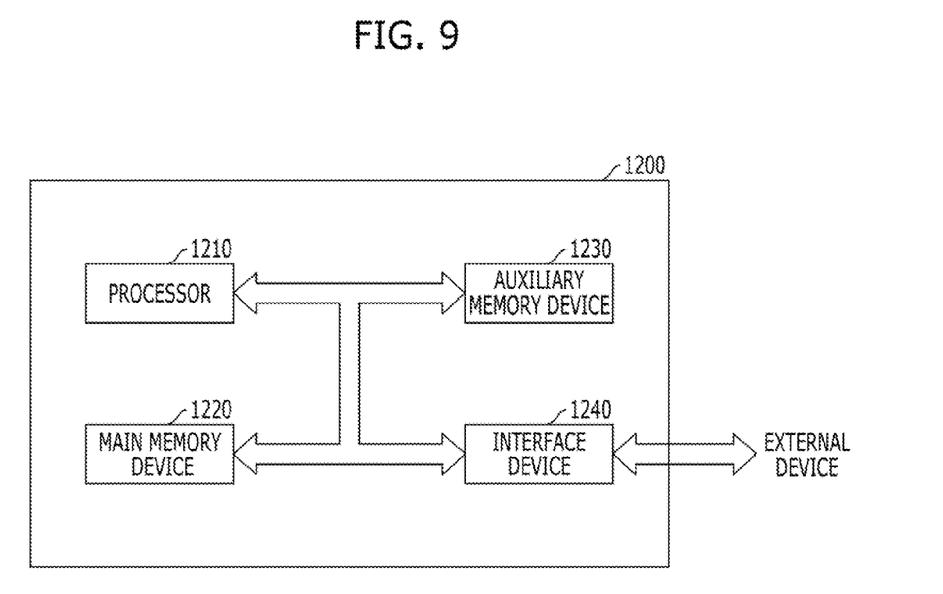
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a resistance variable element which includes a resistance variable element which includes a first structure including a first magnetic layer, a second magnetic layer, and a tunnel barrier layer which is interposed between the first magnetic layer and the second magnetic layer; and a second structure disposed over the first structure, and including a magnetic correction layer for correcting a magnetic field of the first structure, wherein a width of a bottom surface of the second structure is larger than a width of a top surface of the first structure. Through this, a fabrication process of the main memory device 1220 may become easy and the data storage characteristic of the main memory device 1220 may be improved. As a consequence, the operating characteristic of the system 1200 may be improved.

Also, the main memory device 1220 may further include a static random access memory (SRAM), a dynamic random access memory (RAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a resistance variable element which includes a first structure including a first magnetic layer, a second magnetic layer, and a tunnel barrier layer which is interposed between the first magnetic layer and the second magnetic layer; and a second structure disposed over the first structure, and including a magnetic correction layer for correcting a magnetic field of the first structure, wherein a width of a bottom surface of the second structure is larger than a width of a top surface of the first structure. Through this, a fabrication process of the auxiliary memory device 1230 may become easy and the data storage characteristics of the auxiliary memory device 1230 may be improved. As a consequence, the operating characteristic of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
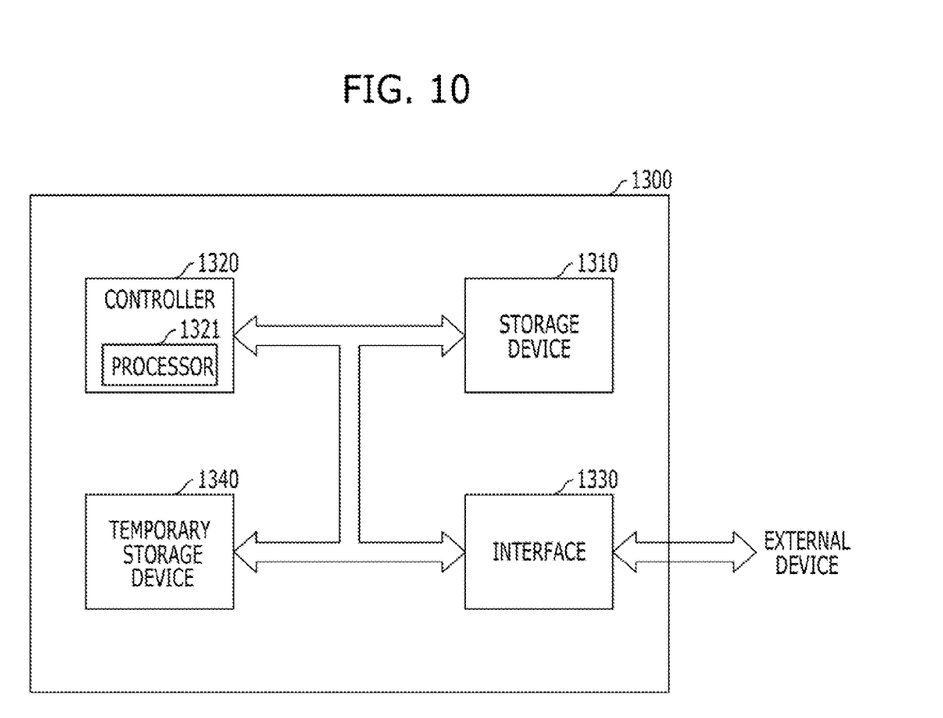
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a resistance variable element which includes a first structure including a first magnetic layer, a second magnetic layer, and a tunnel barrier layer which is interposed between the first magnetic layer and the second magnetic layer; and a second structure disposed over the first structure, and including a magnetic correction layer for correcting a magnetic field of the first structure, wherein a width of a bottom surface of the second structure is larger than a width of a top surface of the first structure. Through this, a fabrication process of the storage device 1310 or the temporary storage device 1340 may become easy and the data storage characteristic of the temporary storage device 1340 may be improved. As a consequence, the operating characteristic of the data storage system 1300 may be improved.

Figure 11:
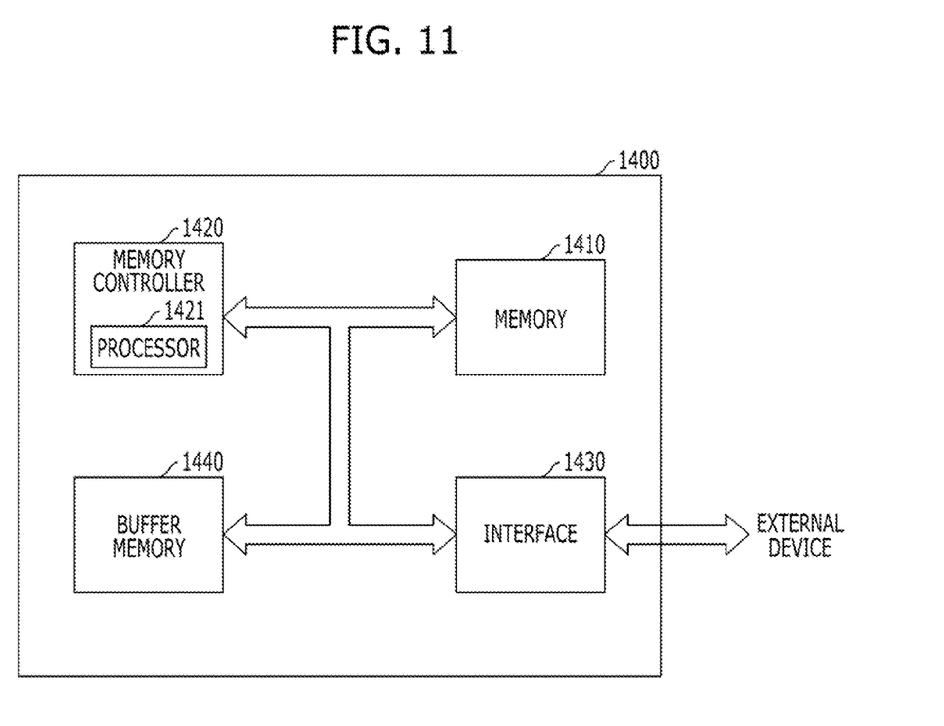
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a resistance variable element which includes a first structure including a first magnetic layer, a second magnetic layer, and a tunnel barrier layer which is interposed between the first magnetic layer and the second magnetic layer; and a second structure disposed over the first structure, and including a magnetic correction layer for correcting a magnetic field of the first structure, wherein a width of a bottom surface of the second structure is larger than a width of a top surface of the first structure. Through this, a fabrication process of the memory 1410 may become easy and the data storage characteristic of the memory 1410 may be improved. As a consequence, the operating characteristic and the data storage characteristic of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a resistance variable element which includes a first structure including a first magnetic layer, a second magnetic layer, and a tunnel barrier layer which is interposed between the first magnetic layer and the second magnetic layer; and a second structure disposed over the first structure, and including a magnetic correction layer for correcting a magnetic field of the first structure, wherein a width of a bottom surface of the second structure is larger than a width of a top surface of the first structure. Through this, a fabrication process of the buffer memory 1440 may become easy and the data storage characteristic of the buffer memory 1440 may be improved. As a consequence, the operating characteristic and the data storage characteristic of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory unit that includes:
   a first structure including a first magnetic layer, a second magnetic layer, a tunnel barrier layer which is interposed between the first magnetic layer and the second magnetic layer and a magnetic insulation layer provided over the second magnetic layer; and
   a second structure disposed over the first structure, and including a magnetic correction layer for correcting a magnetic field of the first structure,
   wherein a width of a bottom surface of the second structure is larger than a width of a top surface of the first structure directly contacted to the bottom surface of the second structure,
   wherein the width of the bottom surface of the second structure is larger than a width of a top surface of the magnetic insulation layer directly contacted to the bottom surface of the second structure.

2. The electronic device according to claim 1, wherein the first structure has a width that gradually increases in a downward direction.

3. The electronic device according to claim 2, wherein sidewalls of the second structure have a profile that is vertical.

4. The electronic device according to claim 1, wherein the second structure further includes a conductive top layer provided over the magnetic correction layer.

5. The electronic device according to claim 1,
   wherein the first magnetic layer has a magnetization direction that is substantially vertical with respect to a surface of the first magnetic layer and is changeable,
   wherein the second magnetic layer has a magnetization direction that is substantially vertical with respect to a surface of the second magnetic layer and is pinned, and
   wherein the magnetic correction layer has a magnetization direction that is substantially opposite to the magnetization direction of the second magnetic layer.

6. The electronic device according to claim 5, wherein a width of a bottom surface of the magnetic correction layer is W1, a width of the tunnel barrier layer is W2, and a width of a damaged portion of the magnetic correction layer is W3, and wherein $W3/2 \leq (W1-W2)/2 \leq W3$.

7. The electronic device according to claim 1, further comprising:

a contact disposed under the first structure and electrically coupled to the first structure, wherein a width of a bottom surface of the first structure is equal to or smaller than a width of a top surface of the contact.

8. The electronic device according to claim 1, further comprising a microprocessor which includes:

a control unit configured to receive a signal including a command from an outside of the microprocessor, and perform extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor.

9. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is part of the cache memory unit in the processor.

10. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is part of the auxiliary memory device or the main memory device in the processing system.

11. The electronic device according to claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory unit is part of the storage device or the temporary storage device in the data storage system.

12. The electronic device according to claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory unit is part of the memory or the buffer memory in the memory system.

* * * * *